(12) United States Patent
Hardy et al.

(10) Patent No.: US 6,982,552 B2
(45) Date of Patent: Jan. 3, 2006

(54) METHODS AND SYSTEMS FOR FABRICATING MAGNETIC RESONANCE GRADIENT COILS

(75) Inventors: Christopher Judson Hardy, Schenectady, NY (US); John Frederick Schenck, Voorheesville, NY (US); William Daniel Barber, Ballston Lake, NY (US); Cornelius Jan Von Morze, Los Altos, CA (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/445,684

(22) Filed: May 27, 2003

(65) Prior Publication Data

US 2004/0239325 A1 Dec. 2, 2004

(51) Int. Cl.
*G01V 3/00* (2006.01)

(52) U.S. Cl. ...................................... 324/307
(58) Field of Classification Search ................ 324/307, 324/309, 318–322
See application file for complete search history.

(56) References Cited

U.S. PATENT DOCUMENTS

| | | | | |
|---|---|---|---|---|
| 4,439,733 A | * | 3/1984 | Hinshaw et al. | 324/322 |
| 4,646,024 A | * | 2/1987 | Schenck et al. | 324/318 |
| 4,737,716 A | * | 4/1988 | Roemer et al. | 324/319 |
| 4,840,700 A |   | 6/1989 | Edelstein et al. | |
| 4,879,515 A | * | 11/1989 | Roemer et al. | 324/318 |
| 4,910,462 A | * | 3/1990 | Roemer et al. | 324/318 |
| 5,304,933 A | * | 4/1994 | Vavrek et al. | 324/318 |
| 5,365,927 A |   | 11/1994 | Roemer et al. | |
| 5,424,643 A | * | 6/1995 | Morich et al. | 324/318 |
| 5,469,060 A | * | 11/1995 | Meyerand | 324/309 |
| 5,488,299 A | * | 1/1996 | Kondo et al. | 324/318 |
| 5,581,185 A |   | 12/1996 | Petropoulos et al. | |
| 5,708,360 A | * | 1/1998 | Yui et al. | 324/318 |
| 5,760,584 A | * | 6/1998 | Frederick | 324/318 |
| 5,793,209 A | * | 8/1998 | Kondo et al. | 324/318 |
| 6,054,854 A | * | 4/2000 | Kawamoto | 324/318 |
| 6,249,121 B1 |   | 6/2001 | Boskamp et al. | |
| 6,320,382 B1 | * | 11/2001 | Anderson | 324/318 |
| 6,437,567 B1 |   | 8/2002 | Schenck et al. | |
| 6,476,607 B1 |   | 11/2002 | Dannels et al. | |
| 6,538,441 B1 |   | 3/2003 | Watkins et al. | |

OTHER PUBLICATIONS

"High Speed, High Field, Planar Surface Gradient Assembly for Fast Imaging," by P.B. Roemer, C.L. Dumoulin, S.P. Souza, And D.R. Eisner; GE Consulting Services Corp., Albany, New York.

* cited by examiner

*Primary Examiner*—Brij Shrivastav
*Assistant Examiner*—Dixomara Vargas
(74) *Attorney, Agent, or Firm*—Fletcher Yoder

(57) ABSTRACT

Methods and apparatus for fabricating a magnetic resonance imaging (MRI) gradient coil for generating magnetic field gradients are provided. The method includes determining a pattern of gradient current paths on a surface using a set of stream functions oriented in at least one of a z-gradient, a y-gradient; and an x-gradient, and arranging conductive material to define a current path that conforms to the determined gradient current paths.

34 Claims, 9 Drawing Sheets

METHODS AND SYSTEMS FOR FABRICATING MAGNETIC RESONANCE GRADIENT COILS

STATEMENT REGARDING FEDERALLY SPONSORED RESEARCH & DEVELOPMENT

The US Government may have certain rights in this invention pursuant to grant ROI RR 15396-01A1 awarded by the National Institute of Health (NIH).

BACKGROUND OF THE INVENTION

This invention relates generally to magnetic resonance imaging systems and more particularly to fabricating gradient coil arrays combined with surface RF coils, and torque-balanced gradient coils.

At least some known MRI scanners use surface RF coils to enhance imaging performance of the scanners. When using MRI for functional imaging or neurological imaging it is desirable to have strong, rapidly switched gradient fields in order to achieve high resolution both spatially and temporally. Local RF coils, or surface coils, are alternatives to RF volume coils for imaging the spine and brain stem. However, surface RF coils may exhibit an inhomogeneous RF field that affects image uniformity, and makes them generally undesirable for use as a transmitter, but may also provide an improved signal-to-noise ratio. For at least some known applications, local insertable MRI gradient coils offer a compromise among the competing performance requirements of linearity, amplitude and slew rate, limited dB/dt, and patient accessibility. Gradient coil designs that are single-sided and flat or slightly curved can be particularly accessible. When this type of gradient coil is operated within a known cylindrical magnet MRI system, the current that produces the magnetic field gradient along the magnet axis, for example, the z-gradient coil, produces a net torque. This is due to a required asymmetry of a transverse component, designated x, of the current. The asymmetry is required in order to produce a field that has the appropriate variation with displacement along z. Assuming a uniform main field, the asymmetry results in unbalanced Lorentz forces directed along the other transverse direction, y, resulting in a net torque about the axis of imbalance, x-axis. Therefore, there is a net torque on the whole gradient coil assembly.

Furthermore, the net torque increases in magnitude with increasing current density in the coil. So, as the gradient coil is operated at higher currents so as to take fuller advantage of the imaging capabilities of the coil, the imaging system is increasingly vulnerable to mechanical motion arising from this torque, which may compromise image quality and introduce a concern for patient comfort when proximate to the coils.

BRIEF DESCRIPTION OF THE INVENTION

In one aspect, a method for fabricating a magnetic resonance imaging (MRI) gradient coil for generating magnetic field gradients are provided. The method includes determining a pattern of gradient current paths on a surface using a set of stream functions oriented in at least one of a z-gradient, a y-gradient; and an x-gradient, and arranging conductive material to define a current path that conforms to the determined gradient current paths.

In another aspect, a torque-balanced gradient coil for magnetic resonance imaging (MRI) is provided. The coil includes an insulating substrate, a continuous conductive layer formed on the substrate, a gradient current path formed on a surface of the substrate defined by etching conductive material from the conductive layer such that the gradient current path conforms to a determined gradient current pattern using a set of stream functions oriented in at least one of a z-gradient, a y-gradient; and an x-gradient, and a counter-torque current path formed on the surface of the substrate, the path defined by etching conductive material from the conductive layer such that the counter-torque current path conforms to a computer optimized counter-torque current pattern.

In yet another aspect, a surface resonator module (SRM) for magnetic resonance imaging (MRI) is provided. The SRM includes at least one surface gradient coil, and at least one surface RF coil wherein each surface RF coil is associated with a respective surface gradient coil.

DETAILED DESCRIPTION OF THE INVENTION

Figure 1:
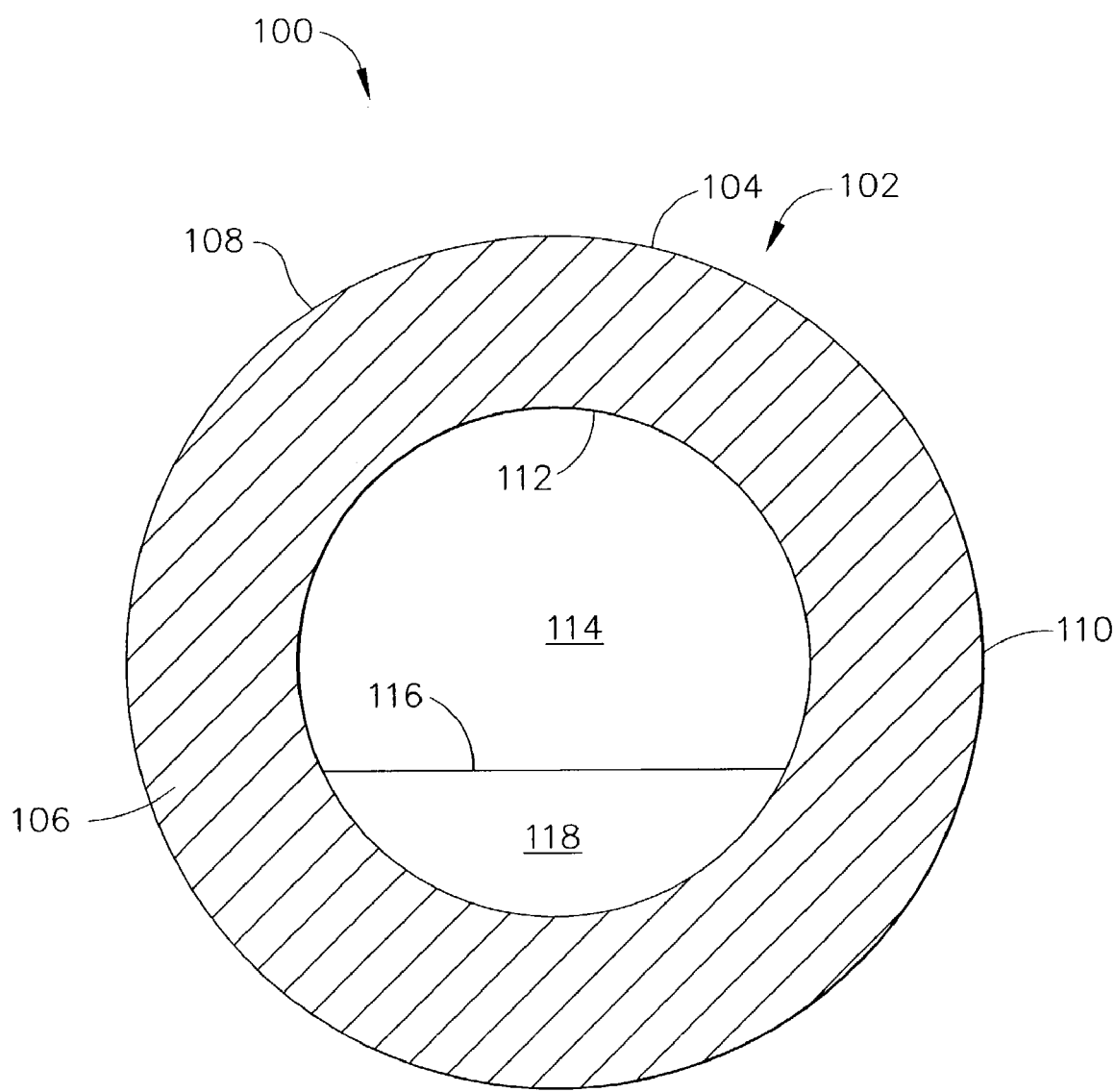
FIG. 1 is a cross-sectional view of an exemplary magnetic resonance imaging (MRI) scanner that includes a volume resonator module (VRM)

Because of the large size of the VRM there are strong fringing fields that lead to eddy current artifacts unless active shielding is used. Also, the VRM design requires the generation of the gradient fields over a much larger volume then necessary if only a limited anatomical region is of interest. This leads to a very high stored energy in the gradient magnet fields. The large extent of the VRM gradient fields leads directly to high coil inductance, power dissipation and dB/dt, all of which limit the peak gradient strength. The high inductance limits the slew rate thereby increasing the acquisition time.

By using a smaller resonator whose gradient field is more localized to the field of interest, the total field energy is facilitated being reduced. For example, higher gradient strengths may be attained prior to reaching the same peak gradient strength. A lower coil inductance permits higher slew rates. Smaller coils positioned away from a coil cryostat facilitate reducing eddy current effects and may lessen or eliminate the need for shielding. Smaller coils also consume less volume inside a patient bore of the VRM resulting in a more open and patient-friendly scanner that allows greater access to the patient for both stimulation and observation during functional imaging. A local gradient coil packaged with an associated RF coil may be called a surface resonator module (SRM). In one embodiment, a second set of gradient coils may be placed above or on the opposite side of the patient to obtain an overall more uniform gradient field.

SRM packages may experience limitations. The SRM FOV may be small since the SRM field decreases at a distance approaching the narrowest coil width. The gradient fields may be nonlinear at the FOV center contributing to image distortion that may be difficult to correct if there are large cross gradient terms. In one embodiment, one of the gradient coils has a uniform field term which interacts with a $B_o$ field that results in a strong torque. Such limitations may be overcome to design coils that facilitate coil interchangeability, and reliable and convenient mounting and securing hardware. A potentially small size of SRMs allows multiple uses. In one embodiment, SRMs are used as interchangeable structures completely replacing the VRM of a scanner. In this embodiment, SRMs permit a greater openness and patient accessibility and mobility, and/or permit the use of a smaller main magnet. In an alternative embodiment, SRMs fit within existing VRM structures and permit imaging at high resolution and high slew rate of small anatomical regions.

An SRM that performs the functions discussed above may be described through mathematical forms for the current densities and stream functions for full x, y and z coil sets and their extension via Fourier series.

As used herein, the terms "coil" and "loop" include any shape that can be formed having a first end of a linear segment adjacent a second opposite end such as, for example, a circle, ellipse, rectangle, and a square. The surface coil can be mounted on any suitable substrate for convenience in handling and positioning. Suitable substrates are materials that are nonconductive and non-magnetic. Additionally, a conductor material of the coils includes a high electrical conductivity such as, for example, but not limited to copper, silver, and superconducting materials.

FIG. 1 is a cross-sectional view of an exemplary magnetic resonance imaging (MRI) scanner 100 that includes a volume resonator module (VRM) 102. VRM 102 includes a substantially cylindrically symmetrical body 104 sized to surround an entire subject body. VRM 102 includes a main magnet 106 that includes an outer peripheral surface 108 that defines a warm bore 110 of VRM 102, and an inner peripheral surface 112 that defines a patient bore 114 of VRM 102. A patient table 116 for supporting a patient (not shown) within patient bore 114, during an examination, is represented by chord 116. VRM 102 occupies approximately thirty-seven percent of the volume within warm bore 110. The volume within warm bore 110 that is available for a patient is further reduced by an inaccessible region 118 beneath the patient table. VRM 102 may occupy approximately fifty percent or more of a cross section of warm bore 110 making it difficult to perform studies which require interaction with the subject.

Figure 2:
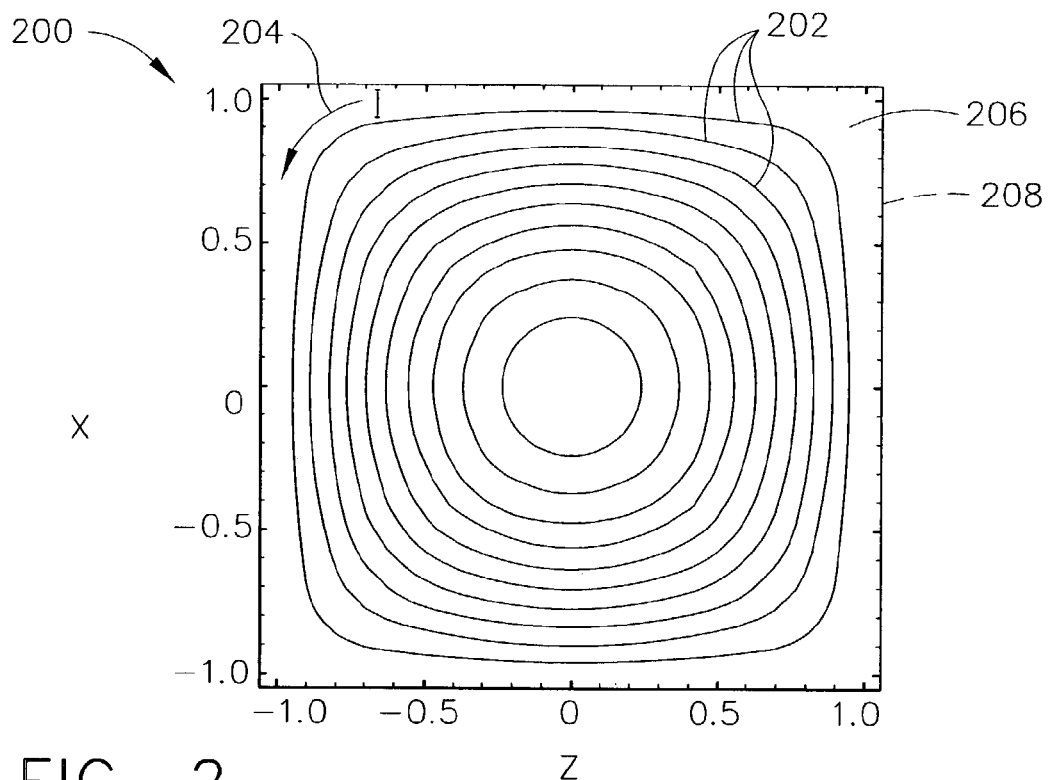
FIG. 2 is a graph illustrating an exemplary streamline pattern for a z-gradient coil with an aspect ratio of x:z=1:1.

FIG. 2 is a graph illustrating an exemplary streamline pattern 200 for a z-gradient coil with an aspect ratio of x:z=1:1. In the exemplary embodiment, a set of current streamlines 202 that channel a coil current 204 to flow in a desired pattern on an etched or machined conductor plane 206 is determined. Conductor plane 206 is formed on an insulating substrate 208. The current is maintained in a fixed plane to form a one-sided gradient coil that has substantially linear gradient fields in any of the three Cartesian directions. As used herein, a z-axis is taken along the cylindrical axis (not shown) of a magnetic field $B_o$ of main magnetic 106, such that z-axis is parallel to $B_o$. In reference to patient table 116, an x-axis may be taken as horizontal (parallel to the table) and a y-axis may be taken as vertical (perpendicular to the plane of the patient table). From the above, a large family of coils that have current symmetric or anti-symmetric in z may be defined that produce substantially line, "gradient" fields around the plane with z=0.

In the exemplary embodiment, the coils are planar and the current density has only x and z components as the coordinate y is perpendicular to the plane of conductor 206. In an alternative embodiment, coil substrate 208 may be deformed or curved in any manner that preserves the symmetry between the coil elements at + and −x and at + and −z without changing the coil from the gradient coil characteristic. Precise values of gradient strength for a given current and the departure from linearity of the resulting field may be modified if a non-planar substrate is used. Still, a resulting gradient field pattern may be determined from the Biot-Savart law. A result of this is that if the coil is designed to operate on a non-planar substrate the equation of the surface, y=y(x,z) should be used in determining the optimum current distribution of current on the coil surface and the resulting field patterns. It may be advantageous to carry out a mapping of coordinates from (x,z) to coordinates on the surface. Additionally, the coils need not be located in the (x,z) plane, vertical orientations (y,z) plane or oblique orientations are also possible.

A stream function, SF, is defined in terms of the surface current density, λ, by $$SF(x, z) = \int_{coiledge}^{(x,z)} \lambda_z(x, z) \, dz.$$

In the exemplary embodiment, there is no current flow perpendicular to the streamlines, therefore the equation of the streamlines is given by:

$SF(x,z)=C$, a constant.

Also, a continuity of current requires that the divergence of the surface current density be zero, or, $$\frac{\partial \lambda_x}{\partial x} + \frac{\partial \lambda_z}{\partial z} = 0.$$

A coil which functions as a z-gradient coil may have the property that $\lambda_x(x,z)=\lambda_x(-x,z)$ and $\lambda_z(x,z)=\lambda_z(x,-z)$. A simple trigonometric function which satisfies this condition is:

$$J_x = A\cos\frac{\pi x}{2w_x}\sin\frac{\pi z}{2w_z}, \text{ with}$$

$$J_z = -A\frac{w_z}{w_x}\cos\frac{\pi z}{2w_z}\sin\frac{\pi z}{2w_x} \text{ and}$$

$$SF = \frac{2A}{\pi}w_z\cos\frac{\pi x}{2w_x}\cos\frac{\pi z}{2w_z}.$$

Here $w_x$ and $w_z$ are the half-widths of the coil in the x and z directions respectively.

One example of a current pattern for a z-gradient coil based on these streamlines is shown in FIG. 2. Note that these stream function suggest whole families of z-gradient coils based on varying the coil aspect ratio, $w_x/w_z$. In addition, still other z-gradient coils can be formed by considering cosine and sine functions of higher orders. As an example, $$J_x = A \cos\frac{n\pi x}{2w_x} \sin\frac{n\pi z}{2w_z} \text{ with } n \text{ odd.}$$

$$\text{and with } J_z = -A\frac{w_z}{w_x}\cos\frac{n\pi z}{2w_z}\sin\frac{n\pi x}{2w_x}.$$

This also permits the design of a large family of coils by superposition and the use of the Fouler series.

Figure 3:
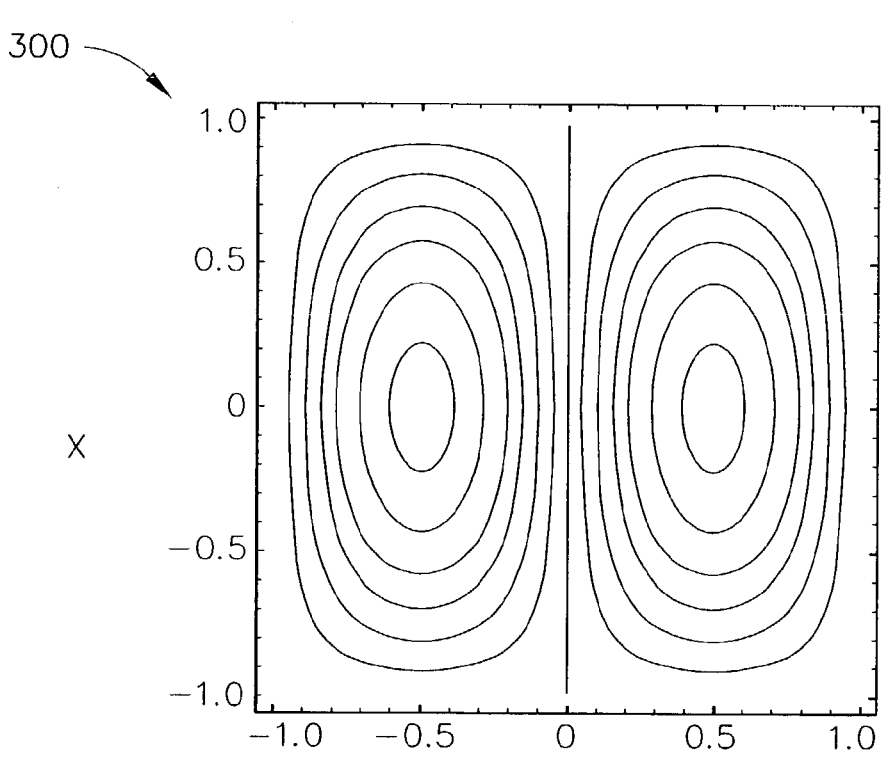
FIG. 3 is a graph illustrating an exemplary streamline pattern for a y-gradient coil with an aspect ratio of x:z=1:1.

FIG. 3 is a graph illustrating an exemplary streamline pattern 300 for a y-gradient coil with an aspect ratio of x:z=1:1. A set of y-gradient coils may be derived from the following stream functions.

$$J_x = A\cos\frac{\pi x}{2w_x}\cos\frac{\pi z}{w_z}, \text{ with}$$

$$J_z = \frac{A}{2}\frac{w_z}{w_x}\sin\frac{\pi z}{w_z}\sin\frac{\pi x}{2w_x} \text{ and}$$

$$SF = -\frac{A}{\pi}w_z\cos\frac{\pi x}{2w_x}\sin\frac{\pi z}{w_z}.$$

One aspect of the y-gradient coils derived from these streamlines is the presence of a non-zero B field at the center of the FOV. In the exemplary embodiment, a second y-gradient coil (not shown) with the opposite polarity is placed beneath the first coil and to adjust the currents in the two coils are adjusted such that the B field of the combined coils is zero at the center of the FOV.

Figure 4:
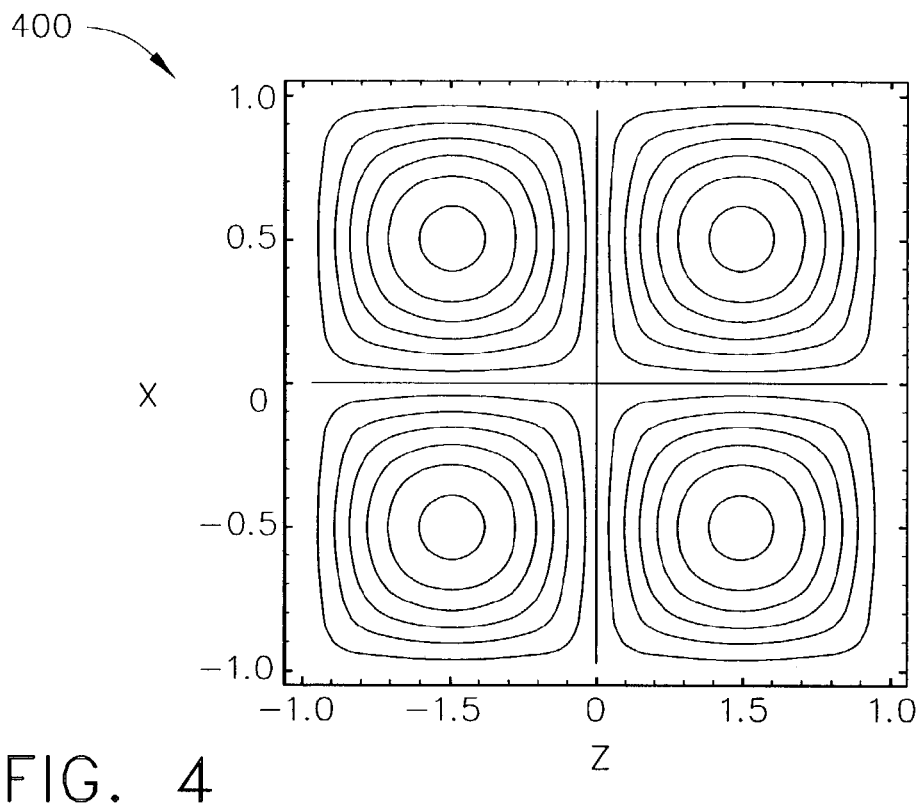
FIG. 4 is a graph illustrating an exemplary streamline pattern for a x-gradient coil with an aspect ratio of x:z=1:1.

FIG. 4 is a graph illustrating an exemplary streamline pattern 400 for an x-gradient coil with an aspect ratio of x:z=1:1. A set of x-gradient coils may be derived from the following stream functions.

$$J_x = A\cos\frac{\pi x}{2w_x}\sin\frac{\pi z}{2w_z}, \text{ with}$$

$$J_z = -A\frac{w_z}{w_x}\cos\frac{\pi x}{2w_z}\sin\frac{\pi x}{2w_x} \text{ and}$$

$$SF = \frac{2A}{\pi}w_z\cos\frac{\pi x}{2w_x}\cos\frac{\pi z}{2w_z}.$$

The above described coils are exemplary only and not limiting. After consideration of specific clinical goals of the coils, the coils to be designed and tested may not be of the simple forms given above, but would incorporate higher order terms from the Fourier series representation to tailor the resultant fields to the specific application. In addition, it is not necessary that coils built with the above streamlines be located on a perfectly flat surface. If the basic coil symmetry is preserved, the coil substrate may be warped or curved as desired without changing the basic field nature. However, the field details may depend on a precise shape of the substrate surface.

Figure 5:
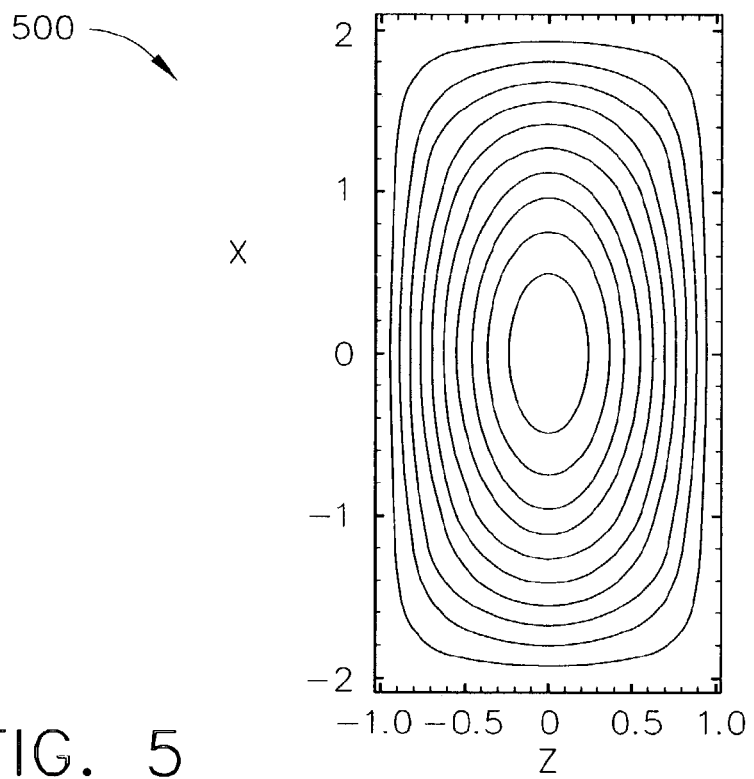
FIG. 5 is a graph illustrating an exemplary streamline pattern for a z-gradient coil with an aspect ratio of x:z=2:1.

FIG. 5 is a graph illustrating an exemplary streamline pattern 500 for a z-gradient coil with an aspect ratio of x:z=2:1. Pattern 500 may be based on the stream function used for the streamline pattern shown in FIG. 2 by varying the coil aspect ratio, $w_x/w_z$. In other embodiments, other aspect ratio coils may be designed using the same stream function with any number of different aspect ratios.

Figures 6, 7:
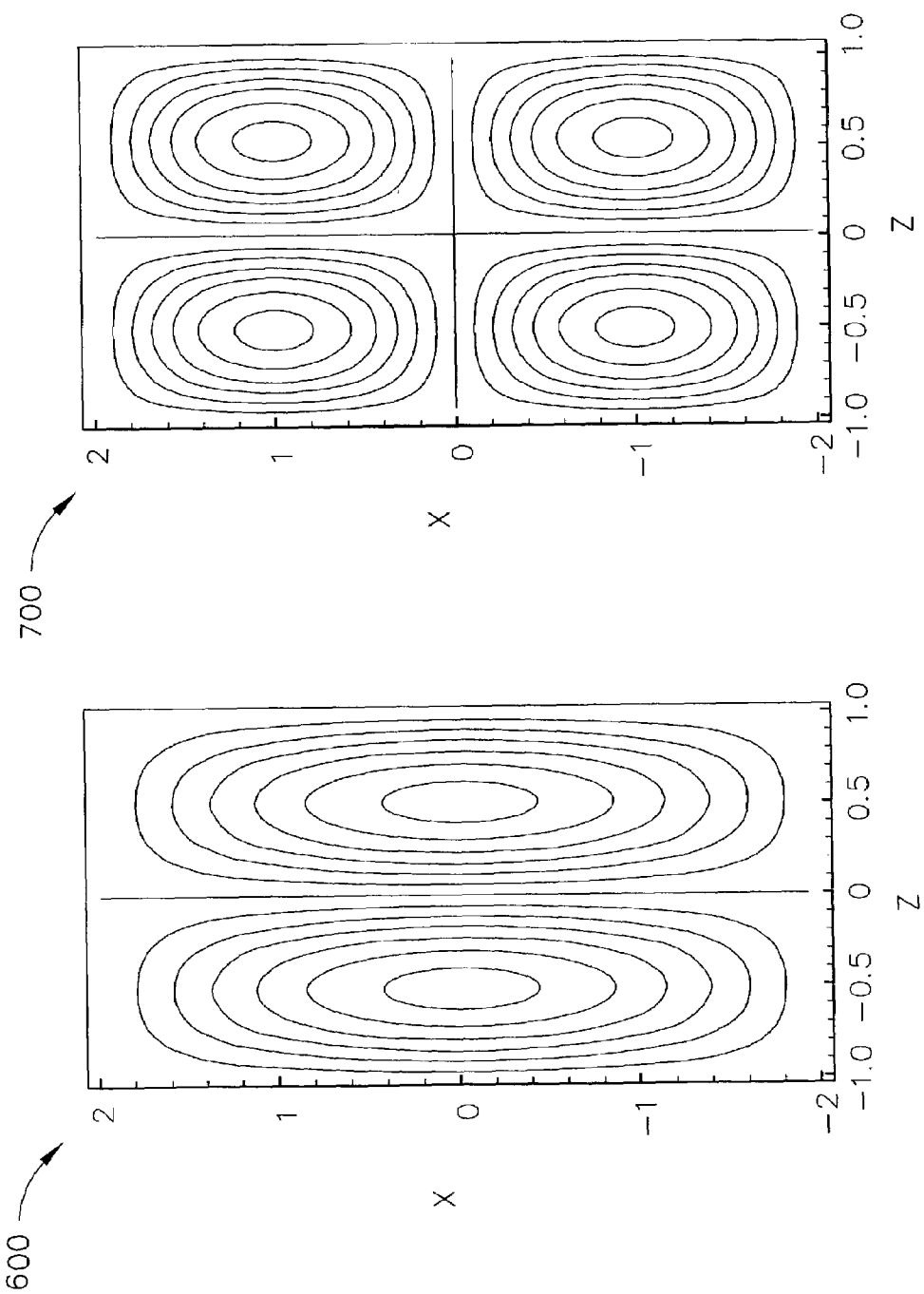
FIG. 6 is a graph illustrating an exemplary streamline pattern for a y-gradient coil with an aspect ratio of x:z=2:1.
FIG. 7 is a graph illustrating an exemplary streamline pattern for a x-gradient coil with an aspect ratio of x:z=2:1.

FIG. 6 is a graph illustrating an exemplary streamline pattern 600 for a y-gradient coil with an aspect ratio of x:z=2:1. Pattern 600 may be based on the stream function used for the streamline pattern shown in FIG. 3 by varying the coil aspect ratio, $w_x/w_z$. In other embodiments, other aspect ratio coils may be designed using the same stream function with any number of different aspect ratios.

FIG. 7 is a graph illustrating an exemplary streamline pattern 700 for a x-gradient coil with an aspect ratio of x:z=2:1. Pattern 700 may be based on the stream function used for the streamline pattern shown in FIG. 4 by varying the coil aspect ratio, $w_x/w_z$. In other embodiments, other aspect ratio coils may be designed using the same stream function with any number of different aspect ratios.

Each of the coils included in a SRM may have different aspect ratios. For example, a SRM may include a z-gradient coil with an aspect ratio of x:z=1:1. a y-gradient coil with an aspect ratio of x:z=2:1, and an x-gradient coil with an aspect ratio of x:z=3:1.

Many other coil designs may be derived from each of the three coil designs and stream functions given above. In this case, the sine and cosine functions given should be considered as only the first terms of a Fourier series, where the subsequent terms in the series maintain the basic symmetry in x and z. This technique is also applicable to the design on non-planar surface gradient coils.

Figure 8:
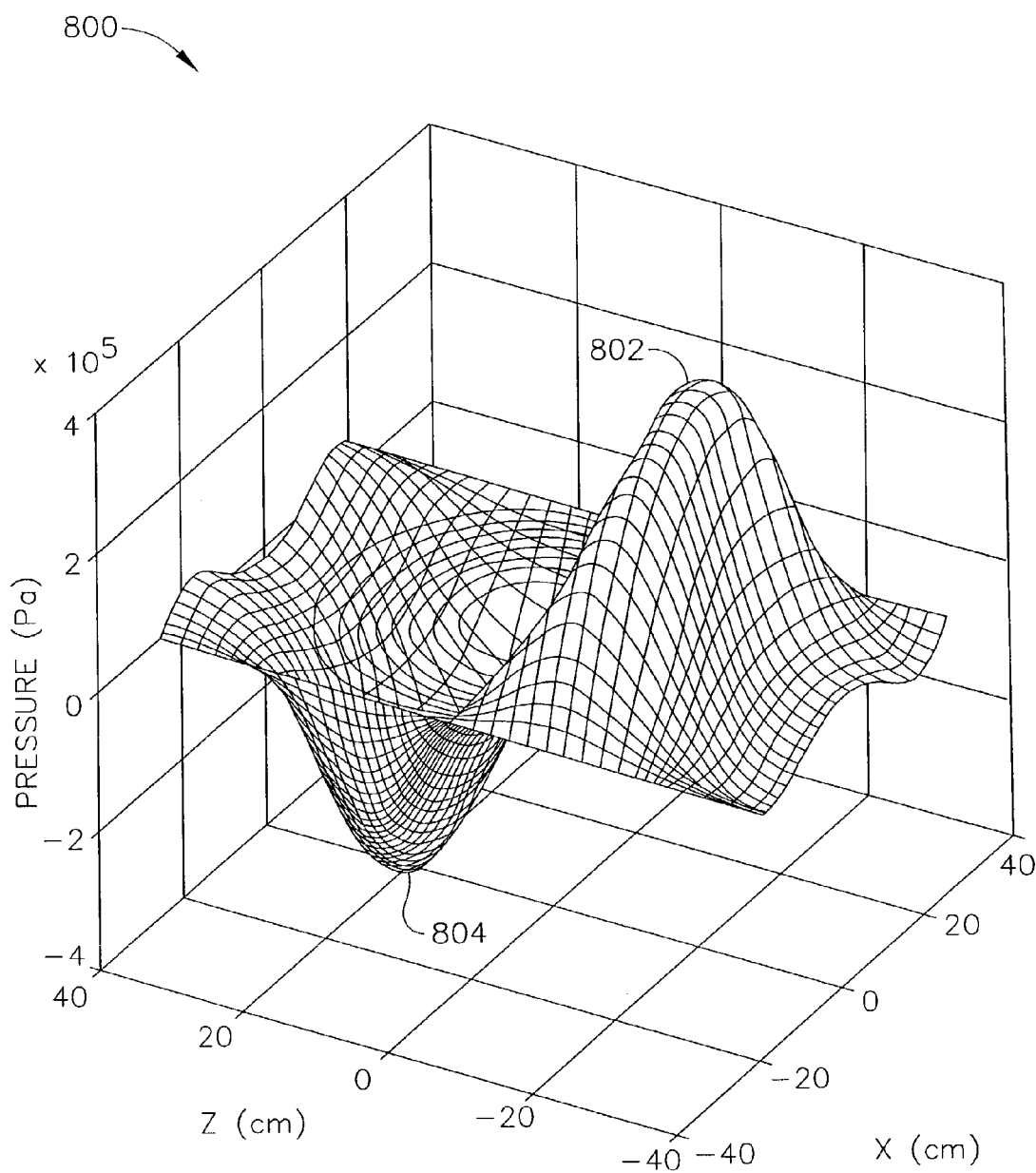
FIG. 8 is a three-dimensional graph of a pressure plot across an exemplary imbalanced basket z-coil.

FIG. 8 is a three-dimensional graph 800 of a pressure plot across an exemplary imbalanced basket z-coil. When a gradient coil that is single-sided and flat, or slightly curved is operated within a cylindrical magnet MRI system, the current that produces the magnetic field gradient along the magnet axis for the z-gradient coil produces a net torque. This is due to an asymmetry of a transverse component, designated x, of the current. The asymmetry is required in order to produce a field that has the appropriate variation with displacement along z. Assuming a uniform main field, the asymmetry results in unbalanced Lorentz forces directed along the other transverse direction, y, resulting in a net torque about the axis of imbalance, x-axis. Therefore, there is a net torque on the whole gradient coil assembly. The torque is illustrated in graph 800 as a local pressure maximum 802 and an aiding local pressure maximum 804. In a single-sided imbalanced z-coil, due to the asymmetry properties of a current producing a z-gradient, substantially all current density has the same handedness of rotation (all clockwise or all counterclockwise with respect to the previously defined y direction). In the exemplary embodiment, the torque tends to rotate the coil about the z=0, y=0 axis. Such a torque on a coil would require restraint by sufficient mechanical fastening system to prevent the coil from moving in the MRI scanner.

Figure 9:
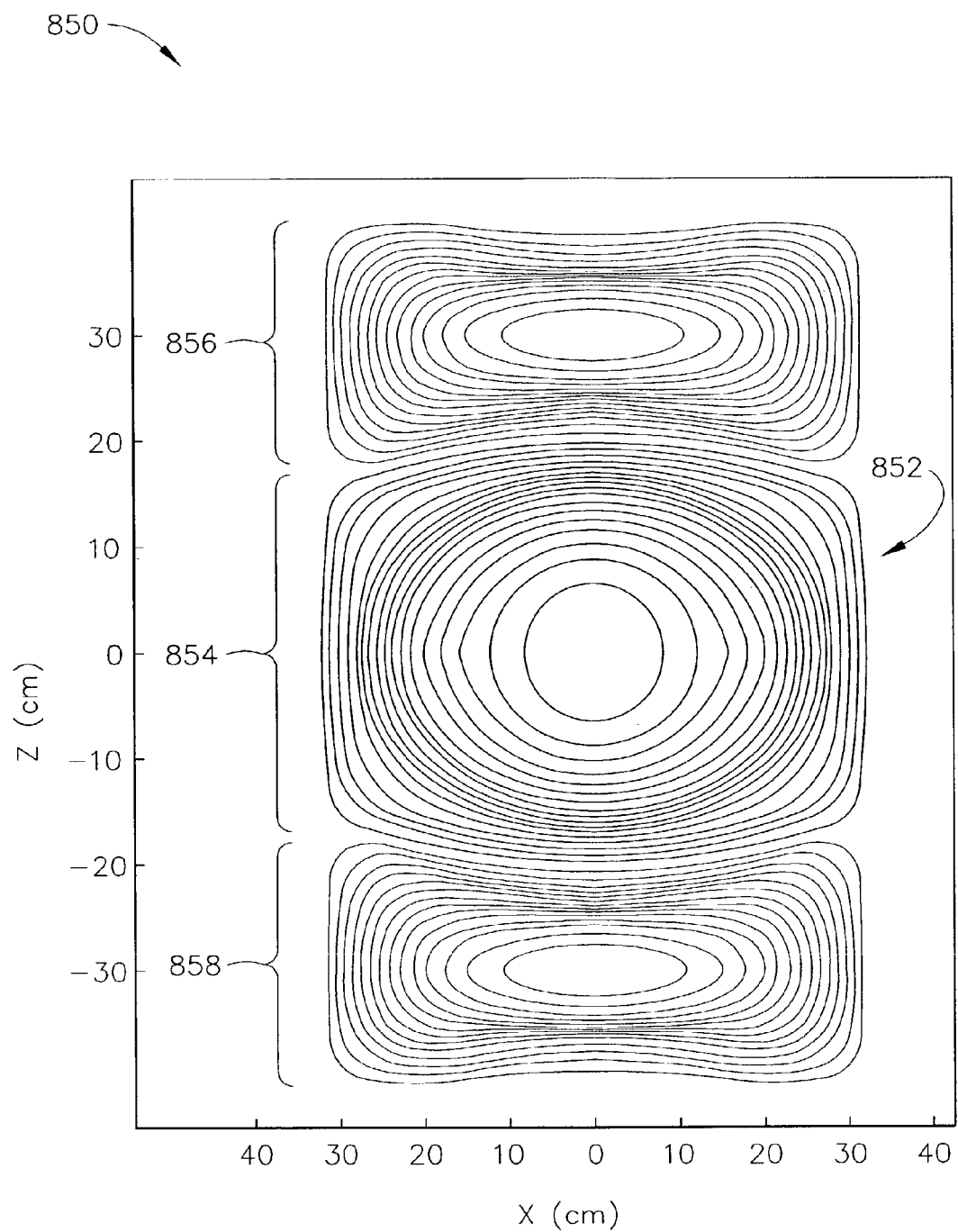
FIG. 9 is a graph illustrating an exemplary streamline pattern for a no-torque, balanced basket z-coil.

FIG. 9 illustrates an exemplary streamline pattern 850 for an balanced basket z-coil 852 that includes an imaging field of view portion 854. A first cancellation torque portion 856 and a second cancellation torque portion 858. In the exemplary embodiment, portions 856 and 858 are located outside imaging field of view portion 854. Currents in portions 856 and 858 induce a torque in coil 852 that substantially cancel a torque that may be generated in portion 854, such that during operation of the coil, at any power level, the net torque generated by coil 852 is substantially zero. additionally, portions 856 and 858 are positioned sufficiently away from field of view portion 854 that portions 856 and 858 have substantially zero net effect on the gradient and/or linearity of field of view portion 854.

Figure 10:
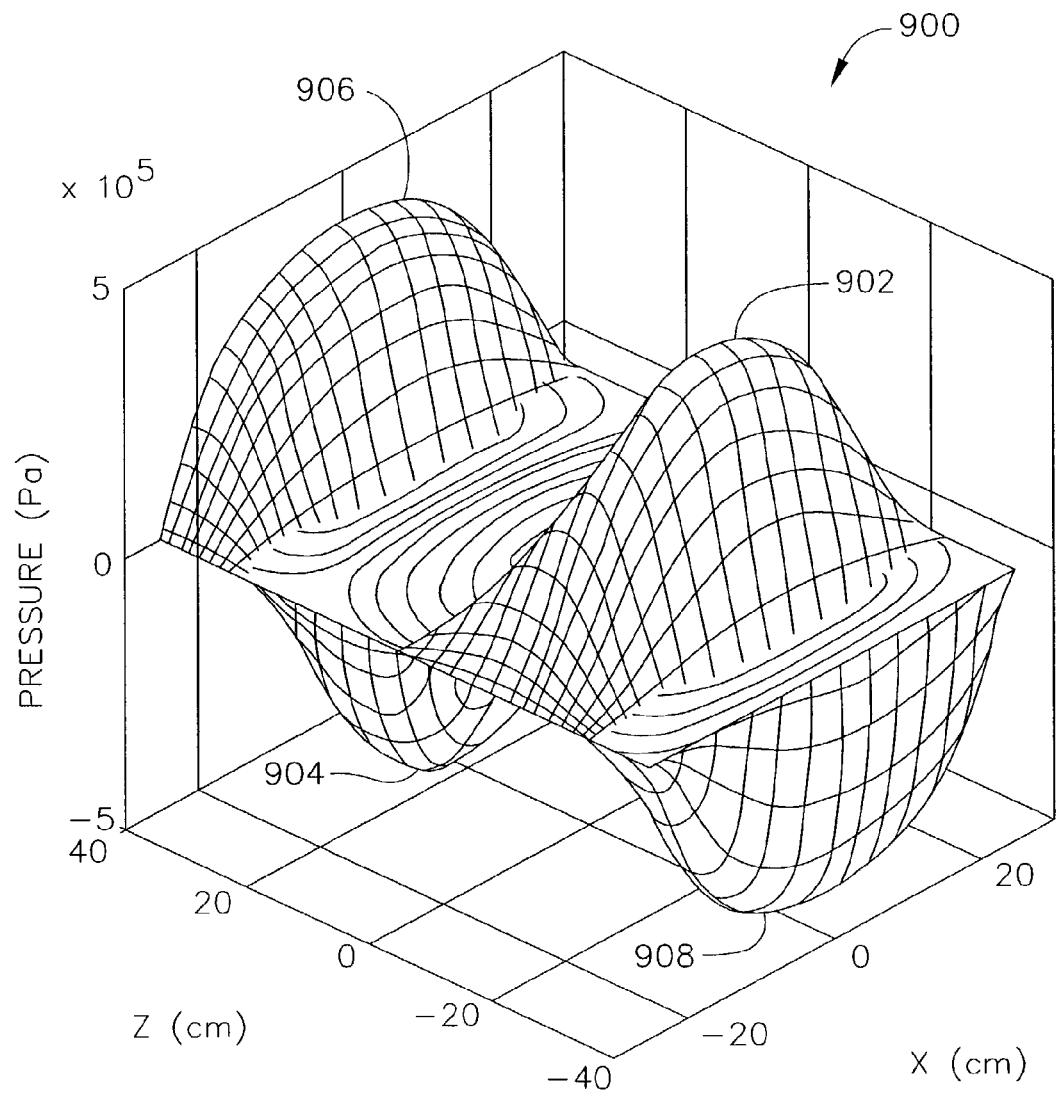
FIG. 10 is a three-dimensional graph of a pressure plot across an exemplary balanced basket z-coil.

FIG. 10 is a three-dimensional graph 900 of a pressure plot across an exemplary balanced basket z-coil. Net torque balance is achieved through the generation of opposite torque on the gradient coil exerted by currents located far from the coil imaging field of view, but mechanically and electrically coupled to the gradient assembly. A source of cancellation torque is current density of opposite handedness positioned proximate to a periphery of the coil, and electrically coupled in series with the currents that produce the z-gradient for imaging. Treating the whole gradient assembly as a rigid body, it may be torque-balanced in this way. In the pressure plot for a torque-balanced z-coil in FIG. 10, he torque is illustrated in graph 900 as a local pressure maximum 902 and an aiding local pressure maximum 904. Additionally, a local pressure maximum 906 opposes the torque caused by local pressure maximum 904 and a local pressure maximum 908 opposes the torque caused by local pressure maximum 902. The result is a substantially net zero torque applied to the rigid body of the gradient assembly. The current density of the torque balancing coils is positioned sufficiently far away from the imaging coils such that image quality is not significantly affected.

Figure 11:
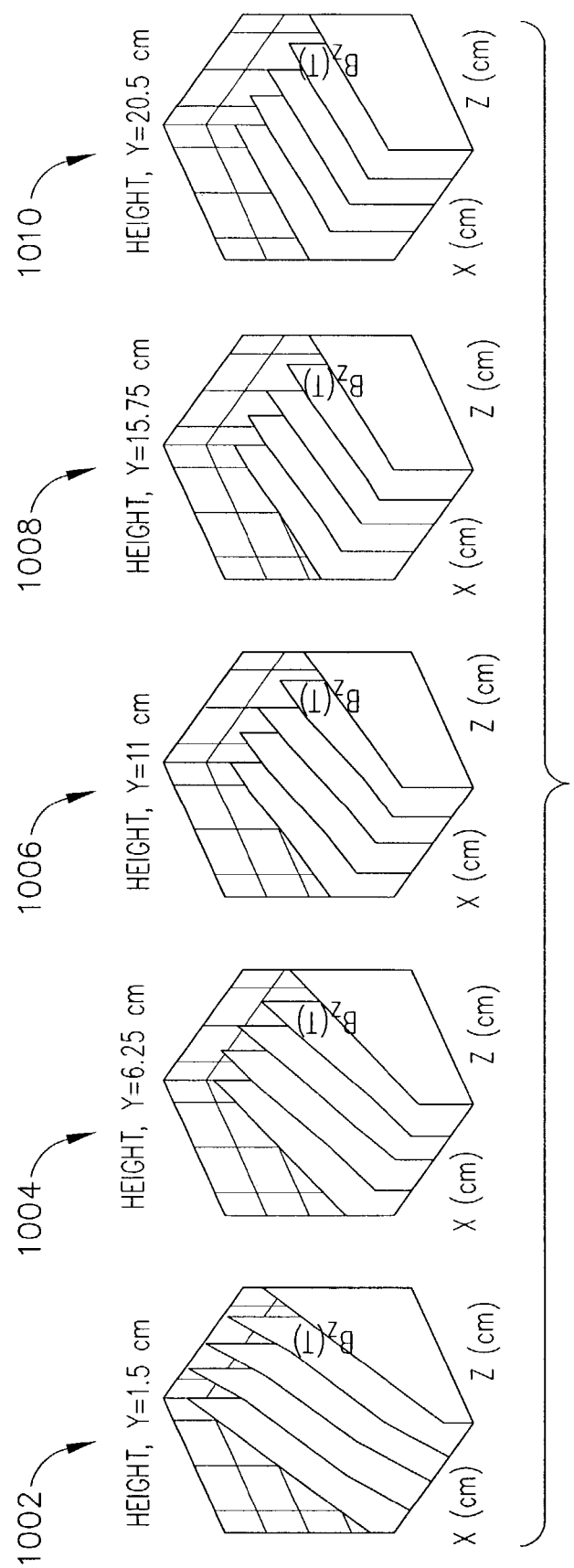
FIG. 11 is a series of exemplary magnetic field gradient plots associated with the coil shown in FIG. 9.

FIG. 11 is a series of exemplary magnetic field gradient plots 1002, 1004, 1006, 1008, and 1010 associated with the coil shown in FIG. 10. Plots 1002, 1004, 1006, 1008, and 1010 illustrate a field gradient at heights above patient table 116 of y=1.5 cm, y=6.25 cm, y=11 cm, y=15.75 cm, and y=20.5 cm, respectively. An average linearity of the gradient produced by this coil is within 1% of that from the coil associated with FIG. 8. Also, placing the balancing currents far from the axis of rotation reduces a current demand for achieving net balance, due to the increased torque provided by the extended lever arm. This extension is limited by the homogeneity of the main field in the region into which the coil extends.

Figure 12:
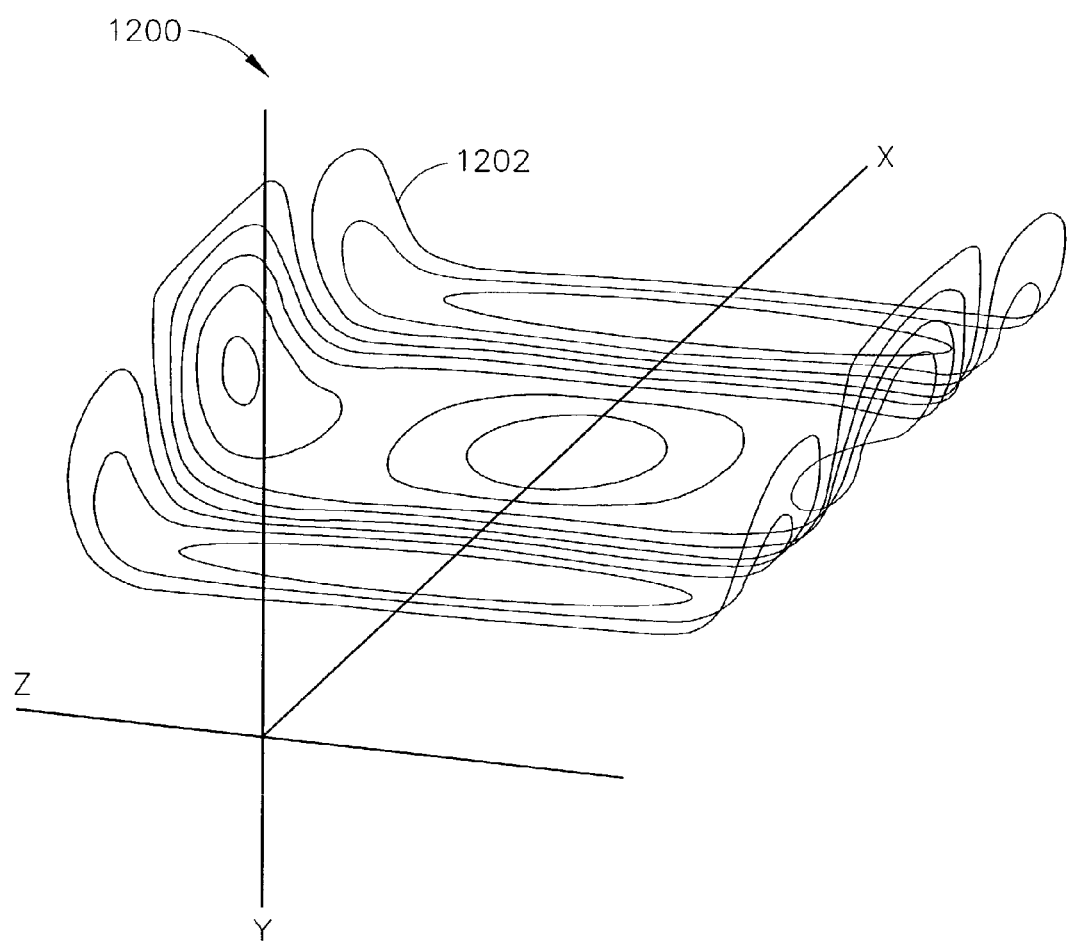
FIG. 12 is a plot of local gradients for an exemplary no-torque, balanced basket z-coil associated with the coil shown in FIG. 9.

FIG. 12 is a plot of local gradients for an exemplary no-torque, balanced basket z-coil 1200 associated with the coil shown in FIG. 9. A basket z-coil may be formed of an insulating substrate that is curved and/or upturned at each end defining a basket-shaped coil. Current flowing through streamlines formed on the curved substrate creates a magnetic field gradient 1202 proximate the coil. In the exemplary embodiment, the z-coil is balanced such that currents in coil portions outside the FOV of the coil produces a torque that counters the torque acting on the coil due to the interaction of the main magnet magnetic field and the magnetic field produced by the main portion of the coil. The net effect of gradient 1202 is that there is substantially no net torque acting on the body of the coil.

A current density distribution that facilitates canceling torque while maintaining the imaging gradient can be obtained through a computerized optimization. For computational efficiency and for convenience of studying the effects of design parameters, the current density function may be expanded as a Fourier series containing terms with the correct symmetry to produce the imaging gradient, and proper phase to ensure continuity of current at the coil edges. The design parameters, including the coefficients of expansion, are then adjusted by a software code segment, which evaluates a cost function associated with each candidate set of design parameters. The cost function includes contributions from the deviation from linearity of the field, and the net torque. When this cost is minimized, the optimal current density distribution is obtained. An actual gradient coil consists of a conductor, typically a copper sheet, which has been etched in a spatial pattern so as to direct electronic currents to flow in such a manner that they produce the desired linear magnetic field. Conversion from the mathematical current density function to the actual copper pattern meant to carry the physical current is achieved through the "stream function" technique described above.

The above-described methods and apparatus provide a cost-effective and reliable means for magnetic resonance imaging. More specifically, the methods and apparatus facilitate replacement of volume gradient coils with local gradient coils that increase the available volume within the magnet bore. This open access facilitates reducing the incidence of anxiety and claustrophobia associated with the confining aspect of conventional scanners, and permits a greater access to the patient for observation, intervention or optimal placement of the region of imaging. Additionally, methods can be employed for fabricating gradient coils with a substantially net zero torque. Therefore, the methods and apparatus described herein facilitate magnetic resonance imaging in a cost-effective and reliable manner.

Exemplary embodiments of magnetic field gradient generating systems are described above in detail. The systems are not limited to the specific embodiments described herein, but rather, components of each system may be utilized independently and separately from other components described herein. Each system component can also be used in combination with other system components.

While the invention has been described in terms of various specific embodiments, those skilled in the art will recognize that the invention can be practiced with modification within the spirit and scope of the claims.

What is claimed is:

1. A method for fabricating a local insertable magnetic resonance imaging (MRI) gradient coil for generating magnetic field gradients, said method comprising:

determining a pattern of gradient current paths on a surface using a set of stream functions oriented in at least one of a z-gradient, a y-gradient; and an x-gradient and including paths forming a counter-torque pattern; and arranging conductive material on a surface to define a current path that conforms to the determined gradient current paths.

2. A method in accordance with claim 1 comprising:

forming a continuous conductive layer coupled to an insulating substrate; and etching conductive material from the conductive layer to define the current path that conforms to the stream function oriented in at least one of the z-gradient, the y-gradient and the x-gradient orientation and including paths forming the counter-torque pattern.

3. A method in accordance with claim 1 comprising placing a discrete wire on an insulating surface to define the current path.

4. A method in accordance with claim 1 wherein the current paths are disposed on a substantially planar surface.

5. A method in accordance with claim 1 wherein arranging conductive material on the surface to define the current path comprises arranging conductive material on a curved or basket-shaped surface.

6. A method in accordance with claim 1 wherein arranging conductive material on the surface to define the current path comprises arranging conductive material to correspond to a predetermined continuous current distribution that is configured to generate a predetermined magnetic field.

7. A method in accordance with claim 1 wherein arranging conductive material on the surface to define the current path comprises arranging conductive material to define a series of arcs on the surface.

8. A method in accordance with claim 1 wherein forming a continuous conductive layer comprises forming a continuous conductive layer that includes copper.

9. A method in accordance with claim 1 wherein etching conductive material from the conductive layer comprises etching conductive material from the conductive layer using a photolithographic mask that defines the determined gradient current paths.

10. A method in accordance with claim 1 wherein forming a continuous conductive layer coupled to an insulating substrate comprises forming a continuous conductive layer coupled to a curved substrate.

11. A method in accordance with claim 1 wherein arranging conductive material on the surface to define the current path comprises the current path for a z-gradient coil using a set of stream functions wherein:

$$J_x = A\cos\frac{\pi x}{2w_x}\sin\frac{\pi z}{2w_z}, \text{with}$$

$$J_z = -A\frac{w_z}{w_x}\cos\frac{\pi z}{2w_z}\sin\frac{\pi x}{2w_x} \text{ and}$$

$$SF = \frac{2A}{\pi}w_z\cos\frac{\pi x}{2w_x}\sin\frac{\pi z}{2w_z}.$$

12. A method in accordance with claim 1 wherein arranging conductive material on the surface to define the current path comprises the current path for a z-gradient coil using a higher order set of stream functions wherein:

$$J_x = A\cos\frac{n\pi x}{2w_x}\sin\frac{n\pi z}{2w_z} \text{ with } n \text{ odd.}$$

$$\text{and with } J_z = -\frac{w_z}{w_x}\cos\frac{n\pi z}{2w_z}\sin\frac{n\pi x}{2w_x}.$$

13. A method in accordance with claim 12 wherein wherein at least one of the sine function and cosine function are the first terms of a Fourier series, and wherein any subsequent terms in the series maintain the basic symmetry in x and z.

14. A method in accordance with claim 1 wherein arranging conductive material on the surface to define the current path comprises the current path for a y-gradient coil using a set of stream functions wherein:

$$J_x = A\cos\frac{\pi x}{2w_x}\cos\frac{\pi z}{w_z}, \text{with}$$

$$J_z\frac{A}{2}\frac{w_z}{w_x}\sin\frac{\pi z}{w_z}\sin\frac{\pi x}{2w_x} \text{ and}$$

$$SF = -\frac{A}{\pi}w_z\cos\frac{\pi x}{2w_x}\sin\frac{\pi z}{w_z}.$$

15. A method in accordance with claim 14 wherein at least one of the sine function and cosine function are the first terms of a Fourier series, and wherein any subsequent terms in the series maintain the basic symmetry in x and z.

16. A method in accordance with claim 1 wherein arranging conductive material on the surface to define the current path comprises the current path for a x-gradient coil using a set of stream functions wherein:

$$J_x = A\cos\frac{\pi x}{2w_x}\sin\frac{\pi z}{2w_z}, \text{with}$$

$$J_z = -A\frac{w_z}{w_x}\cos\frac{\pi x}{2w_z}\sin\frac{\pi x}{2w_x} \text{ and}$$

$$SF = \frac{2A}{\pi}w_z\cos\frac{\pi x}{2w_x}\cos\frac{\pi z}{2w_z}.$$

17. A method in accordance with claim 16 wherein wherein at least one of the sine function and cosine function are the first terms of a Fourier series, and wherein any subsequent terms in the series maintain the basic symmetry in x and z.

18. A method in accordance with claim 1 wherein arranging conductive material on the surface to define the current path comprises the current path for a multi-layer gradient coil to produce magnetic field patterns.

19. A method in accordance with claim 18 wherein arranging conductive material for defining the current paths for a multi-layer gradient coil comprises arranging conductive material for defining the current paths for a multi-layer, substantially planar gradient coil.

20. A method in accordance with claim 18 further comprising forming a multi-layer gradient coil to produce magnetic field patterns.

21. A method in accordance with claim 1 further comprising forming a surface resonator module (SRM) wherein the SRM includes a gradient coil and an associated RF coil.

22. A method in accordance with claim 21 wherein forming a surface resonator module comprises forming an SRM that includes at least one of a z-gradient coil, a y-gradient coil, and an x-gradient coil.

23. A method in accordance with claim 22 wherein forming an SRM comprises forming an SRM that includes a plurality of RF coils.

24. A method in accordance with claim 21 wherein the sizes and positions of the RF coils are chosen so that the sensitive regions of the coils fall only within the substantially linear region of the gradient coils.

25. A method in accordance with claim 1 further comprising forming a gradient coil of one of a plurality of aspect ratios.

26. A method in accordance with claim 25 wherein forming a gradient coil of one of a plurality of aspect ratios comprises forming a substantially planar gradient coil.

27. A method in accordance with claim 1 further comprising forming a torque-balanced gradient coil using a determined counter-torque current pattern located outside the field of view (FOV) of the central gradient coil pattern that generates an opposite handed torque such that a net torque operating on the gradient coil is substantially zero.

28. A method in accordance with claim 27 comprising forming a counter-torque current path in electrical series with the current path.

29. A local insertable magnetic resonance coil made by method of claim 1.

30. A method for fabricating a torque-balanced local insertable magnetic resonance imaging (MRI) gradient coil for generating magnetic fields said method comprising:
arranging conductive material on a surface to define a pattern of a gradient current path on a surface using a set of stream functions oriented in at least one of a z-gradient, a y-gradient; and an x-gradient;

arranging conductive material on the surface to define a pattern of counter-torque current path on the surface wherein a current flowing in the counter-torque current path is optimized to generate a magnetic field that produces torque that balances the torque produced by a current flowing through the gradient current path;

forming a continuous conductive layer coupled to an insulating substrate; and etching conductive material from the conductive layer to define a current path that conforms to the gradient current path and the counter-torque current path.

31. A method in accordance with claim 30 further comprising forming a surface resonator module (SRM) wherein the SRM includes a gradient coil and an associated RF coil.

32. A method in accordance with claim 31 wherein forming a surface resonator module comprises forming an SRM that includes at least one of a z-gradient coil, a y-gradient coil, and an x-gradient coil.

33. A method in accordance with claim 32 wherein forming an SRM comprises forming an SRM that includes a plurality of RF coils.

34. A local insertable magnetic resonance coil made by method of claim 30.

* * * * *